(12) United States Patent
Shima et al.

(10) Patent No.: US 7,476,941 B2
(45) Date of Patent: Jan. 13, 2009

(54) SEMICONDUCTOR INTEGRATED CIRCUIT DEVICE AND FABRICATION PROCESS THEREOF

(75) Inventors: Masashi Shima, Kawasaki (JP); Yosuke Shimamune, Kawasaki (JP); Akiyoshi Hatada, Kawasaki (JP); Akira Katakami, Kawasaki (JP); Naoyoshi Tamura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/712,418

(22) Filed: Mar. 1, 2007

(65) Prior Publication Data
US 2007/0148835 A1    Jun. 28, 2007

Related U.S. Application Data

(62) Division of application No. 11/136,710, filed on May 25, 2005, now Pat. No. 7,202,120.

(30) Foreign Application Priority Data
Feb. 24, 2005    (JP)    ............... 2005-049609

(51) Int. Cl.
H01L 23/62    (2006.01)
(52) U.S. Cl. .................. 257/357; 257/69; 257/204; 257/206; 257/274; 257/350; 257/351; 257/511; 257/512; 257/E27.057; 257/E27.064; 257/E21.611; 257/E21.612; 257/E21.632
(58) Field of Classification Search .............. 257/204, 257/274, 69, 206, 338, 351, 357, 377, 369, 257/350, 511, 512, E27.057, E27.064, E21.611, 257/E21.612, E21.632
See application file for complete search history.

(56) References Cited

U.S. PATENT DOCUMENTS 6,255,123 B1    7/2001    Reis
2004/0029323 A1    2/2004    Shimizu et al.

FOREIGN PATENT DOCUMENTS

WO    WO 0243151    5/2002

OTHER PUBLICATIONS

Y. Nakahara et al.; "A Robust 65-nm Node CMOS Technology for Wide-range Vdd Operation", 2003 IEEE.
A. Shimizu et al.; "Local Mechanical-Stress Control (LMC): A New Technique for CMOS-Performance Enhancement", 2001 IEEE.

*Primary Examiner*—Long K Tran
(74) *Attorney, Agent, or Firm*—Westerman, Hattori, Daniels & Adrian, LLP.

(57) ABSTRACT

A semiconductor integrated circuit includes an n-channel MOS transistor and a p-channel MOS transistor formed respectively in first and second device regions of a substrate, the n-channel MOS transistor including a first gate electrode carrying sidewall insulation films on respective sidewall surfaces thereof, the p-channel MOS transistor including a second gate electrode carrying sidewall insulation films on respective sidewall surfaces thereof, wherein there is provided a stressor film on the substrate over the first and second device regions such that the stressor film covers the first gate electrode including the sidewall insulation films thereof and the second gate electrode including the sidewall insulation films thereof, wherein the stressor film has a decreased film thickness in the second device region at least in the vicinity of a base part of the second gate electrode.

12 Claims, 11 Drawing Sheets

SEMICONDUCTOR INTEGRATED CIRCUIT DEVICE AND FABRICATION PROCESS THEREOF

CROSS-REFERENCE TO RELATED APPLICATIONS

This application is a divisional of application Ser. No. 11/136,710, filed on May 25, 2005, now U.S. Pat. No. 7,202,120, which is based on Japanese priority application No. 2005-049609 filed on Feb. 24, 2005, the entire contents of which are hereby incorporated by reference.

BACKGROUND OF THE INVENTION

The present invention generally relates to semiconductor devices and more particularly to a semiconductor device having improved operational speed as a result of application of stress.

With progress in the art of device miniaturization, it is now becoming possible to realize ultrafine and ultra fast semiconductor devices having a gate length of 100 nm or less.

With such ultrafine and ultra fast transistors, the area of the channel region right underneath the gate electrode is much smaller than conventional semiconductor devices, and thus, the mobility of electrons or holes traveling through the channel region is influenced heavily by the stress applied to such a channel region.

Thus, various attempts have been made for optimizing the stress applied to the channel region in the prospect of improving the operational speed of the semiconductor device further.

REFERENCES (Reference 1) WO2002/043151
(Reference 2) Shimizu. A., et al. IEDM2001
(Reference 3) Nakahara, Y., et al. IEDM2003

SUMMARY OF THE INVENTION

Conventionally, there is proposed a structure for improving the operational speed of an n-channel MOS transistor by forming a stressor film typically of SiN accumulating therein a tensile stress in a device region of an n-channel MOS transistor so as to include the gate electrode for improvement of electron mobility in the channel region right underneath the gate electrode.

FIG. 1 shows the schematic construction of an n-channel MOS transistor having such a stressor film.

Referring to FIG. 1, a device region 11A of the n-channel MOS transistor is formed on a silicon substrate 11 by a STI device isolation region 11I in the form of a p-type well, and a gate electrode 13 is formed on the silicon substrate 11 in the device region 11A in correspondence to the channel region via a gate insulation film. Further, source and drain extension regions 11a and 11b of n-type are formed in the silicon substrate 11 at both lateral sides of the gate electrode 13.

Further, sidewall insulation films 13A and 13B are formed at respective sidewall surfaces of the gate electrode 13, and source and drain extension regions 11c and 11d of $n^+$-type are formed in the silicon substrate at respective outer sides of the sidewall insulation films 13A and 13B in continuation with the drain extension regions 11a and 11b.

Further, silicide layers 14A and 14B are formed on the respective surface parts of the source and drain diffusion regions 11c and 11d, and a silicide layer 14C is formed further on the gate electrode 13.

Further, with the construction of FIG. 1, there is formed an SiN film accumulating therein a tensile stress on the silicon substrate 11 so as to cover a gate structure that includes the gate electrode 13, the sidewall insulations 13A and 13B and further the silicide layer 14.

It should be noted that such a stressor film 15 urges the gate electrode 13 toward the silicon substrate 11, and as a result, there is induced a compressive stress in the channel region right underneath the gate electrode 13 in the direction perpendicular to the substrate surface. With this, a tensile stress is induced in the direction parallel to the substrate surface (in-plane tensile stress).

With such a construction, there is caused an increase of electron mobility, and hence corresponding improvement of operational speed, in the channel region of the n-channel MOS transistor, while it is also known that, in the case a p-channel MOS transistor is formed on the same silicon substrate 11, such a tensile stress of the stressor film 15 causes decrease of hole mobility in the channel region of the p-channel MOS transistor in the event such a stressor film 15 is formed also on the p-channel MOS transistor. Thereby, the operational speed of the p-channel MOS transistor is degraded.

Thus, in order to eliminate this problem, it has been proposed in Non-Patent Reference 1 to introduce Ge ions into the tensile SiN stressor film selectively in the device region of the p-channel MOS transistor for relaxation of stress.

FIG. 2 shows the construction of a CMOS semiconductor device according to Non-Patent Reference 1, wherein those parts corresponding to the parts described previously are designated by the same reference numerals and the description thereof will be omitted.

Referring to FIG. 2, a device region 11B of the p-channel MOS transistor is defined on the silicon substrate 11 by the device isolation region 11I in the form of an n-type well, and a gate electrode 23 is formed on the silicon substrate 11 in the device region 11B via the gate insulation film 22. Further, source and drain extension regions 21a and 21b of p-type are formed in the silicon substrate 11 at respective lateral sides of the gate electrode 23.

Further, sidewall insulation films 23A and 23B are formed on respective sidewall surfaces of the gate electrode 23, and source and drain diffusion regions 21c and 21d of $p^+$-type are formed in the silicon substrate 11 at the respective outer sides of the sidewall insulation films 23A and 23B in continuation with the source and drain extension regions 21a and 21b.

Further, silicide layers 24A and 24B are formed on the respective surface parts of the source and drain diffusion regions 21c and 21d and a silicide layer 24C is formed on the gate electrode 23.

Further, with the construction of FIG. 2, the SiN film 15 is formed so as to cover the device region 11B including the gate electrode 23 as the stressor film.

With such a construction, desired increase of electron mobility is attained in the channel region of the n-channel MOS transistor as a result of application of the compressive stress to the channel region by the tensile SiN stressor film 15 similarly to the case of FIG. 1, while it should be noted that there occurs also unwanted decrease of hole mobility in the channel region of the p-channel MOS transistor.

Thus, with the construction of FIG. 2, the device region 11A is covered with a resist pattern R1 and Ge ions are introduced into the tensile SiN stressor film 15 into the device region 11B, more precisely into the part of the SiN film 15 covering the device region 11B by an ion implantation process, while using the resist pattern R1 as a mask. With this, the tensile stress in the SiN film 15 is relaxed in the part corresponding to the device region 11B.

According to the construction of FIG. 2, it is thus possible to avoid degradation of operational speed of the p-channel MOS transistor formed in the device region by causing relaxation of the tensile stress in the SiN film 15 in the device region 11B, while in order to realize effective stress relaxation of the SiN film 15 with such Ge ion implantation process, it is necessary that the injected Ge ions travel through the SiN film 15 over a long distance as shown in FIG. 2 by a broken line in order to reach the region close to the interface to the underlying silicide layer 24A or 24B. However, injection of Ge ions into such a deep level of the SiN film 15 requires very large acceleration energy at the time of the ion implantation process, and it is difficult to apply this technology to actual fabrication process of semiconductor devices.

Further, Non-Patent Reference 2 discloses the technology of reducing, with the construction of FIG. 2, the compressive stress applied to the channel region of the p-channel MOS transistor in the device region 11B, by reducing the thickness of the SiN film 15 with the construction of FIG. 2 as shown in FIG. 3, by conducting an etching process while using the resist pattern R1 as a mask. In FIG. 3, those parts corresponding to the parts explained previously are designated by the same reference numerals and the description thereof will be omitted.

With such a construction, it is certainly possible to apply a compressive stress to the channel region of the n-channel MOS transistor in the direction perpendicular to the substrate surface while reducing the similar compressive stress applied to the channel region of the p-channel MOS transistor. However, control of thickness of the SiN film 15 is difficult, and there arises a problem that the variation of characteristics of the p-channel MOS transistor is increased.

Further, the SiN film 15 is the film used also for the etching stopper at the time of formation of contact holes in correspondence to the source and drain regions 24A and 24B, and thus, excessive decrease of the film thickness caused in the SiN film 15 may invite the problem that the SiN film 15 cannot stop the etching used for formation of the contact holes and the silicide layers 24A and 24B or the underlying diffusion regions 21c and 21d experience damaging by the etching.

Further, with such a construction, there appears a step in the SiN film 15 at the boundary between the device region 11A and the device region 11B, while such a step causes difficulties in the process of formation of multilayer interconnection structure conducted thereafter.

In a first aspect, the present invention provides a semiconductor integrated circuit, comprising:

a substrate;

first and second device regions defined on said substrate by a device isolation region;

an n-channel MOS transistor formed on said first device region; and a p-channel MOS transistor formed in said second device region;

said n-channel MOS transistor comprising: a first gate electrode doped to n-type and formed on said first device region in correspondence to a channel region of said n-channel MOS transistor via a first gate insulation film, said first gate electrode carrying sidewall insulation films on respective sidewall surfaces thereof; source and drain regions of n-type formed in said first device region at respective lateral sides of said first gate electrode, said p-channel MOS transistor comprising: a second gate electrode doped to p-type and formed in said second device region in correspondence to a channel region of said p-channel MOS transistor, said second gate electrode carrying sidewall insulation films on respective sidewall surfaces thereof; and source and drain regions of p-type formed in said second device region at respective lateral sides of said second gate electrode, wherein there is provided a stressor film on said substrate over said first and second device regions such that said stressor film covers said first gate electrode in said first device region including said sidewall insulation films thereof and such that said stressor film covers said second gate electrode in said second device region including said sidewall insulation films thereof, said stressor film having a decreased film thickness in said second device region at least in the vicinity of a base part of said second gate electrode.

In another aspect, the present invention provides a method of fabricating a semiconductor integrated circuit device, comprising the steps of:

forming an n-channel MOS transistor having a first gate electrode and a p-channel MOS transistor having a second gate electrode respectively on first and second device regions defined on a substrate by a device isolation region;

forming a stressor film accumulating therein a tensile stress on said substrate so as to cover said first and second device regions continuously including said first gate electrode and sidewall insulation films thereon and said second gate electrode and sidewall insulation films thereon; and introducing, in said second device region, an element causing relaxation of said tensile stress into said stressor film obliquely by an ion implantation process such that said stressor film undergoes stress relaxation in said second device region, said ion implantation process being conducted under such an energy that said element reaches said sidewall insulation film of said second gate electrode at least in the vicinity of a base part of said second gate electrode.

According to the present invention, it becomes possible, with the semiconductor integrated circuit device comprising an n-channel MOS transistor and a p-channel MOS transistor formed respectively on first and second device regions of a substrate, a stressor film being formed on the substrate so as to cover the n-channel MOS transistor for improving operational speed of the n-channel MOS transistor, to interrupt the path of stress propagation from the stressor film to a channel region of the p-channel MOS transistor, by introducing an element causing stress relaxation into the stressor film for the part thereof covering the p-channel MOS transistor, particularly the part covering the base part of the gate electrode of the p-channel MOS transistor, by way of an oblique ion implantation process under the energy that causes the element to reach the sidewall insulation film formed on the gate electrode of the p-channel MOS transistor. With this, the compressive stress applied by the stressor film perpendicularly to the substrate surface at the channel region of the p-channel MOS transistor is effectively interrupted, and deterioration of operational speed of the p-channel MOS transistor is avoided. Particularly, by applying an etching process to the stressor film after the foregoing oblique ion implantation process, the part of the stressor film in which the foregoing element has penetrated is etched away selectively, and the efficiency of interruption of stress propagation is improved further.

According to the present invention, there is no need of reducing the film thickness of the tensile stress for the entirety of the second device region, and it becomes possible to secure a sufficient film thickness for the part where the contact plugs make a contact with the source and drain regions of the p-channel MOS transistor, and thus, the stressor film functions as an effective contact etching stopper in the device region of the p-channel MOS transistor.

Other objects and further features of the present invention will become apparent from the following detailed description when read in conjunction with the attached drawings.

DETAILED DESCRIPTION OF THE INVENTION

FIRST EMBODIMENT

Figure 4:
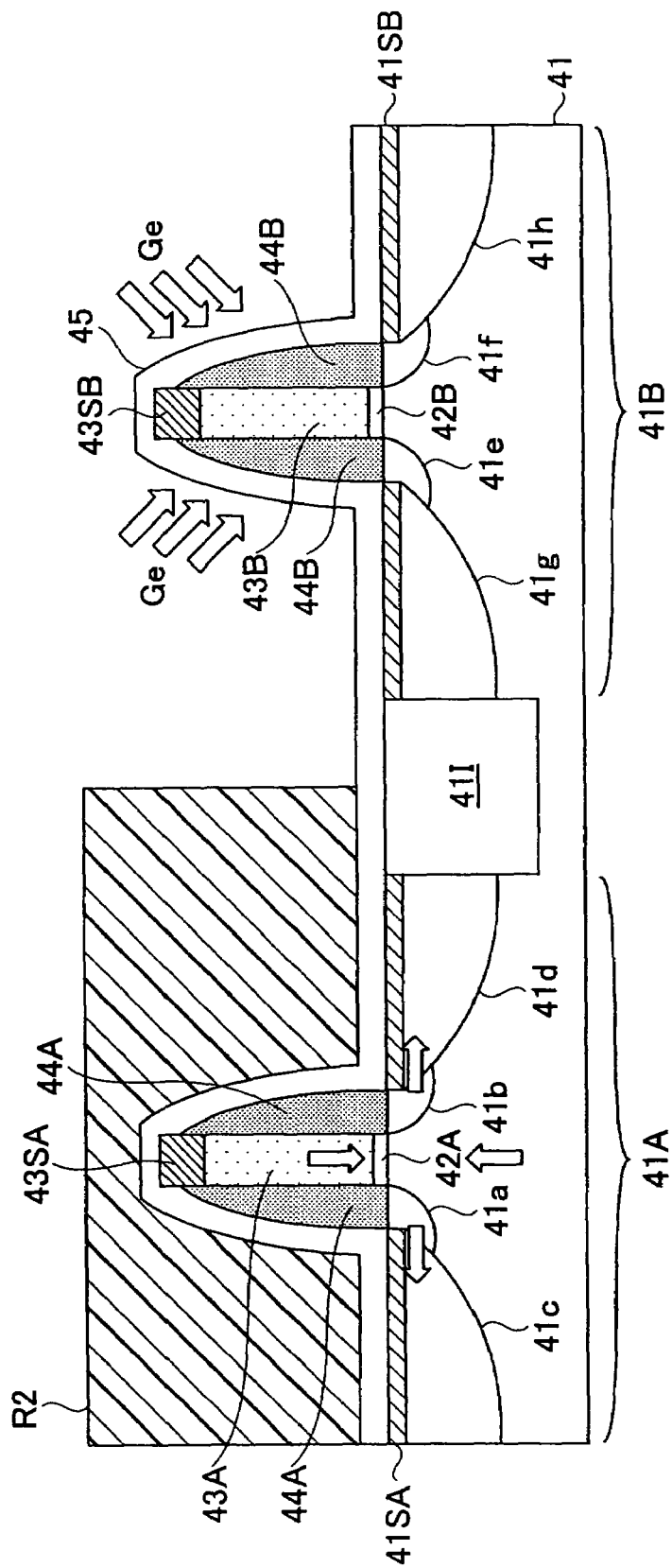
FIGS. 4-6 are diagrams showing the fabrication process of a semiconductor integrated circuit device according to a first embodiment of the present invention.
Figure 5:
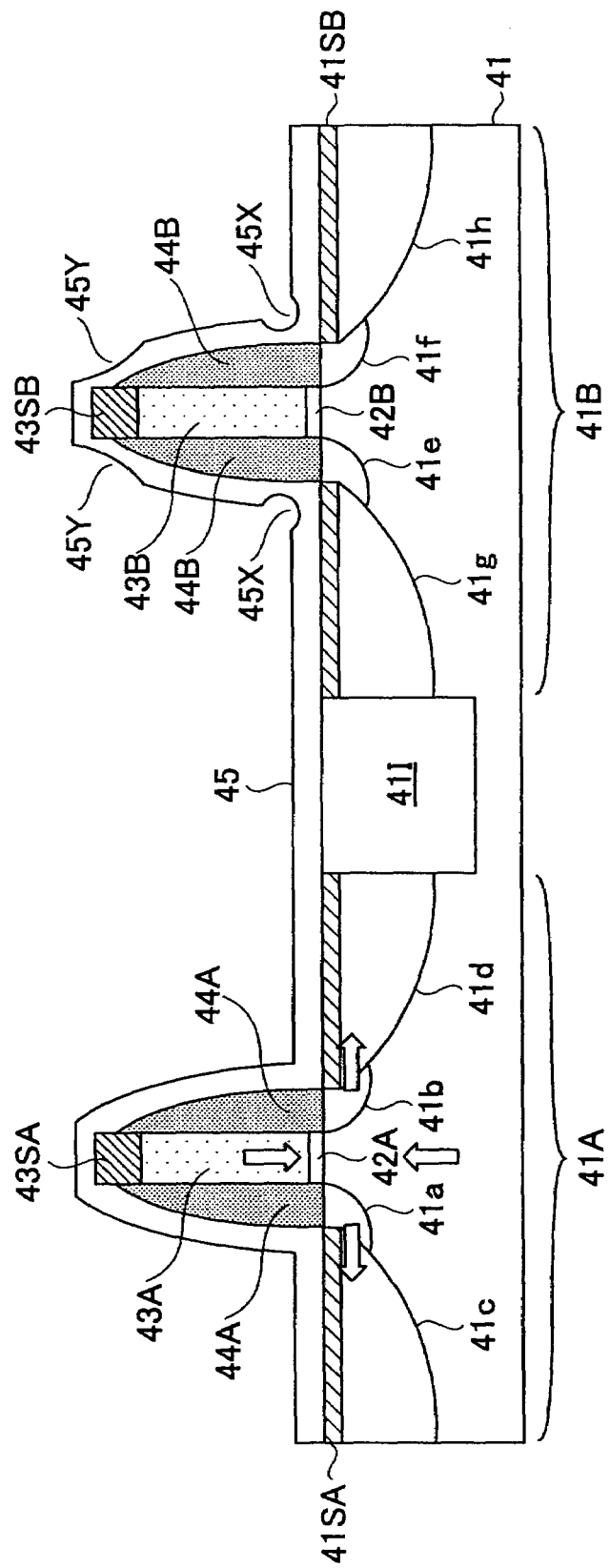
Figure 6:
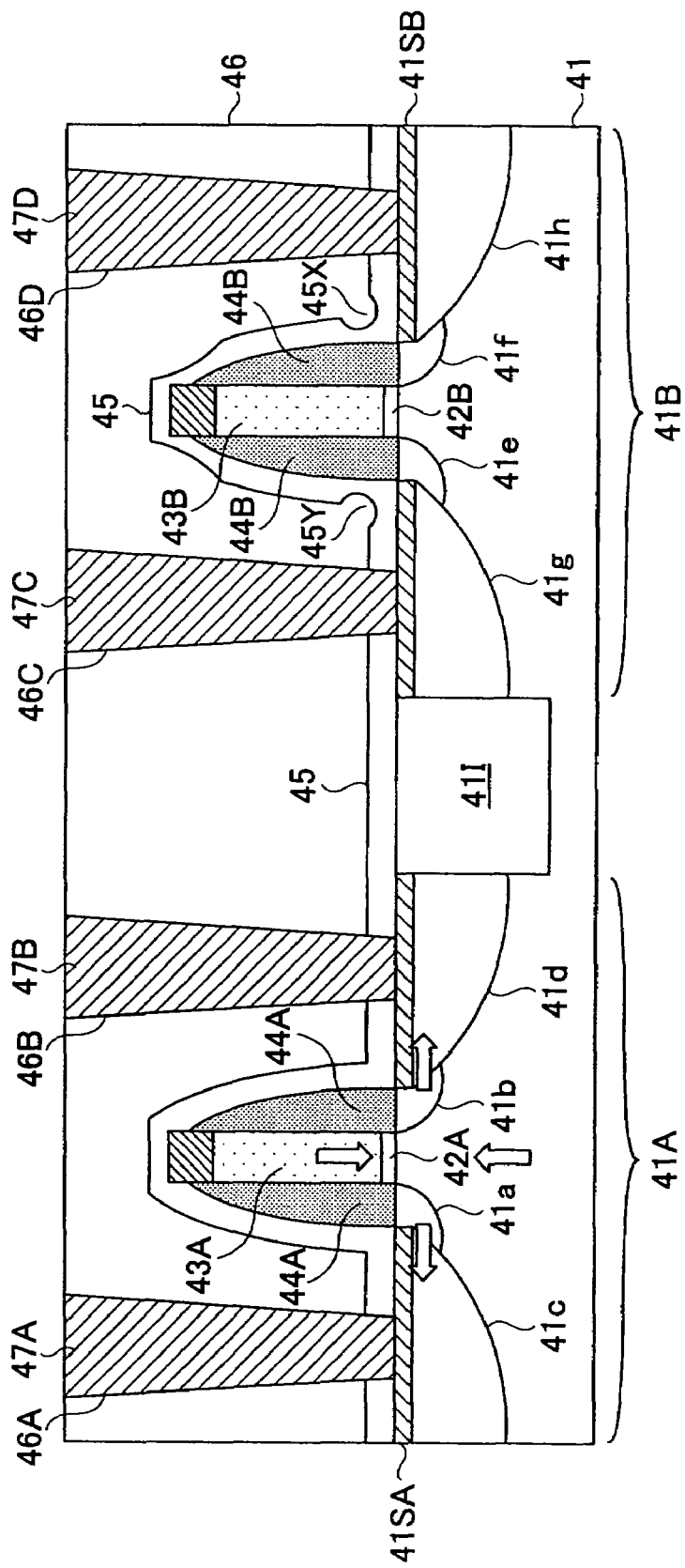

FIGS. 4-6 are diagrams showing the fabrication process of a semiconductor integrated circuit device according to a first embodiment of the present invention;

Referring to FIG. 4, there are formed first and second device regions 41A and 41B on a silicon substrate 41 by an STI device isolation region 41I respectively in the form of a p-type well and an n-type well, and an n-channel MOS transistor is formed on the first device region 41A and a p-channel MOS transistor is formed on the second device region 41B.

More specifically, a polysilicon gate electrode 43A of $n^+$-type is formed on the silicon substrate 41 in the device region 41A via a gate insulation film 42A of SiON, or the like, and a pair of sidewall insulation films 44A of SiN are formed on respective sidewall surfaces of the polysilicon gate electrode 43A.

Further, there are formed a source extension region 41c and a drain extension region 41b of n-type in the silicon substrate 41 at respective lateral sides of the gate electrode 43A in the device region 41A, and a source region 41c and a drain region 41d of $n^+$-type are formed in the silicon substrate 41 at respective outer sides of the sidewall insulation films 44A respectively in overlapping relationship with the source extension region 41a and the drain extension region 41b.

Further, there are formed silicide layers 41SA of cobalt or nickel silicide on the surfaces of the source and drain regions 41c and 41d, and a similar silicide layer 43SA is formed on the polysilicon gate electrode 43A.

Similarly, a polysilicon gate electrode 43B of $p^+$-type is formed on the silicon substrate 41 in the device region 41B via a gate insulation film 42B of SiON, or the like, and a pair of sidewall insulation films 44B of SiN are formed on respective sidewall surfaces of the polysilicon gate electrode 43B.

Further, there are formed a source extension region 41e and a drain extension region 41f of n-type in the silicon substrate 41 at respective lateral sides of the gate electrode 43B in the device region 41B, and a source region 41g and a drain region 41h of $p^+$-type are formed in the silicon substrate 41 at respective outer sides of the sidewall insulation films 44B respectively in overlapping relationship with the source extension region 41f and the drain extension region 41g.

Further, there are formed silicide layers 41SB of cobalt or nickel silicide on the surfaces of the source and drain regions 41g and 41h, and a similar silicide layer 43SB is formed on the polysilicon gate electrode 43B.

It should be noted that any of the n-channel MOS transistor and the p-channel MOS transistor are formed to have a gate length of 100 nm or less, such as 40 nm.

Figure 1:
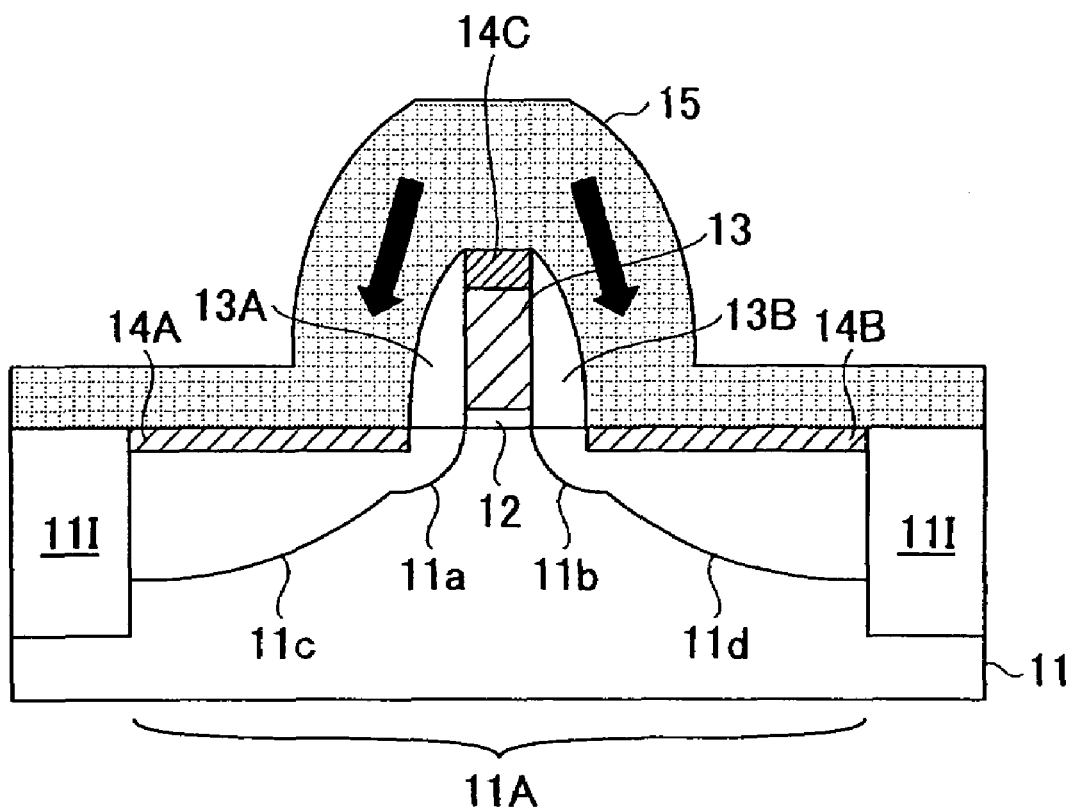
FIG. 1 is a diagram showing the principle of the n-channel MOS transistor having a conventional stressor film.

Further, in the construction of FIG. 4, it should be noted that an SiN film 45 accumulating therein a tensile stress is formed on the silicon substrate 41 as a stressor film so as to cover the gate electrodes 43A and 43B including the respective sidewall insulation films 44A and 44B with the thickness of 100 nm, typically by a low-pressure CVD process at the substrate temperature of 600° C. while supplying a mixed gas of $SiCl_2H_2$ and $NH_3$ as the source gases, and as a result, the channel region right underneath the gate electrode 43A is compressed perpendicularly to the substrate surface in the device region 41A by the tensile stress accumulated in the SiN film 45 similarly to the case of FIG. 1 explained previously.

With this, there is induced, in the channel region of the n-channel MOS transistor, a strain similarly to the case in which an in-plane tensile stress is applied to the substrate surface in the direction parallel to the substrate surface as represented by arrows, and the operational speed of the n-channel MOS transistor is improved in the device region 41A as explained with reference to FIG. 1.

In the state of FIG. 4, on the other hand, it should be note that the SiN film 45 is covered by a resist pattern R2 in the device region 41A, and Ge ions are introduced into the SiN film 45 in the device region 41B by an oblique ion implantation process conducted under the acceleration voltage of 60 eV with the dose of $1 \times 10^{15}$ cm$^{-2}$ and with an oblique angle of 45 degrees, for example.

Figure 2:
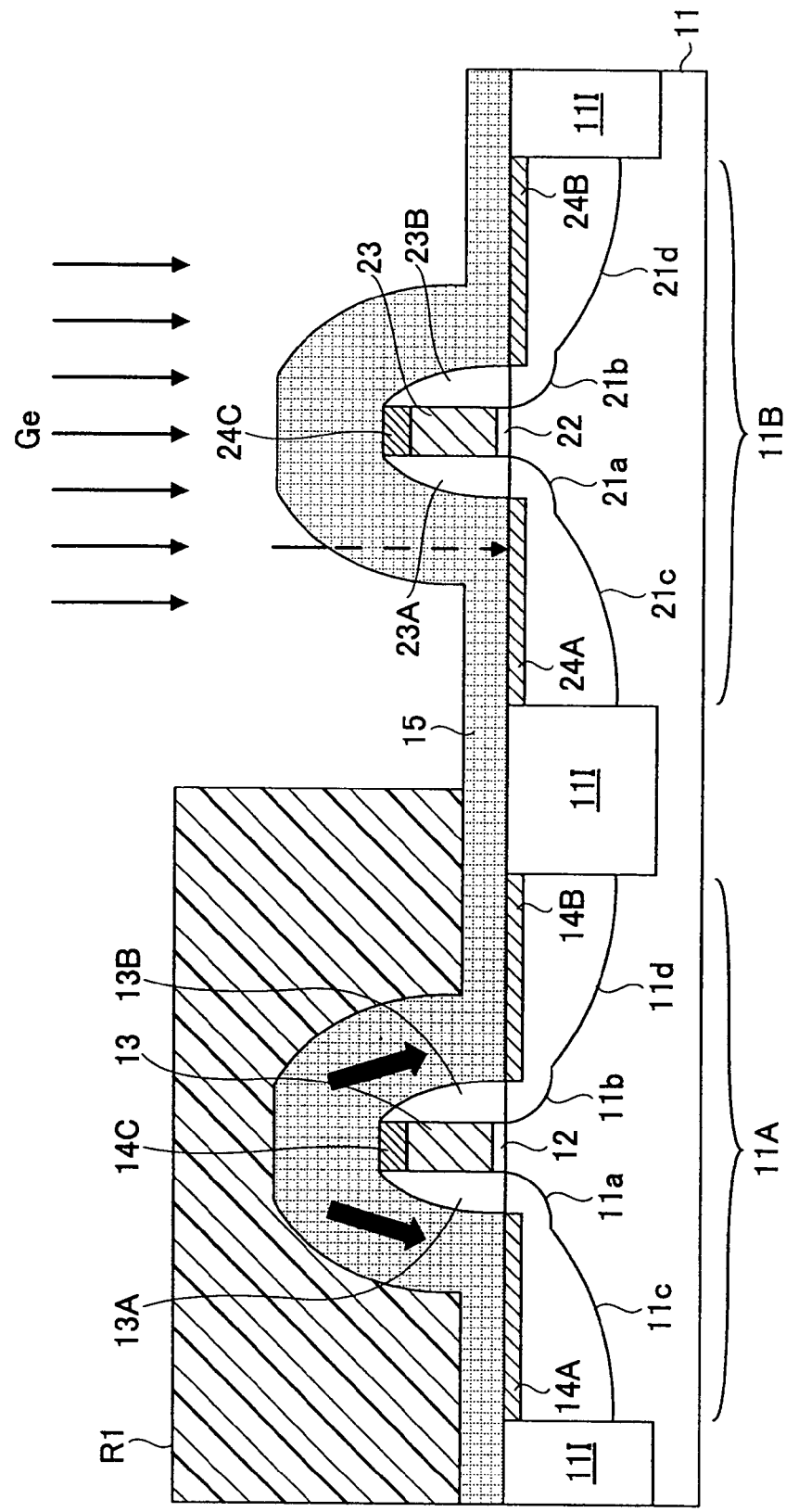
FIG. 2 is a diagram showing the construction of a conventional semiconductor integrated circuit device in which a stressor film is formed on an n-channel MOS transistor therein.
Figure 3:
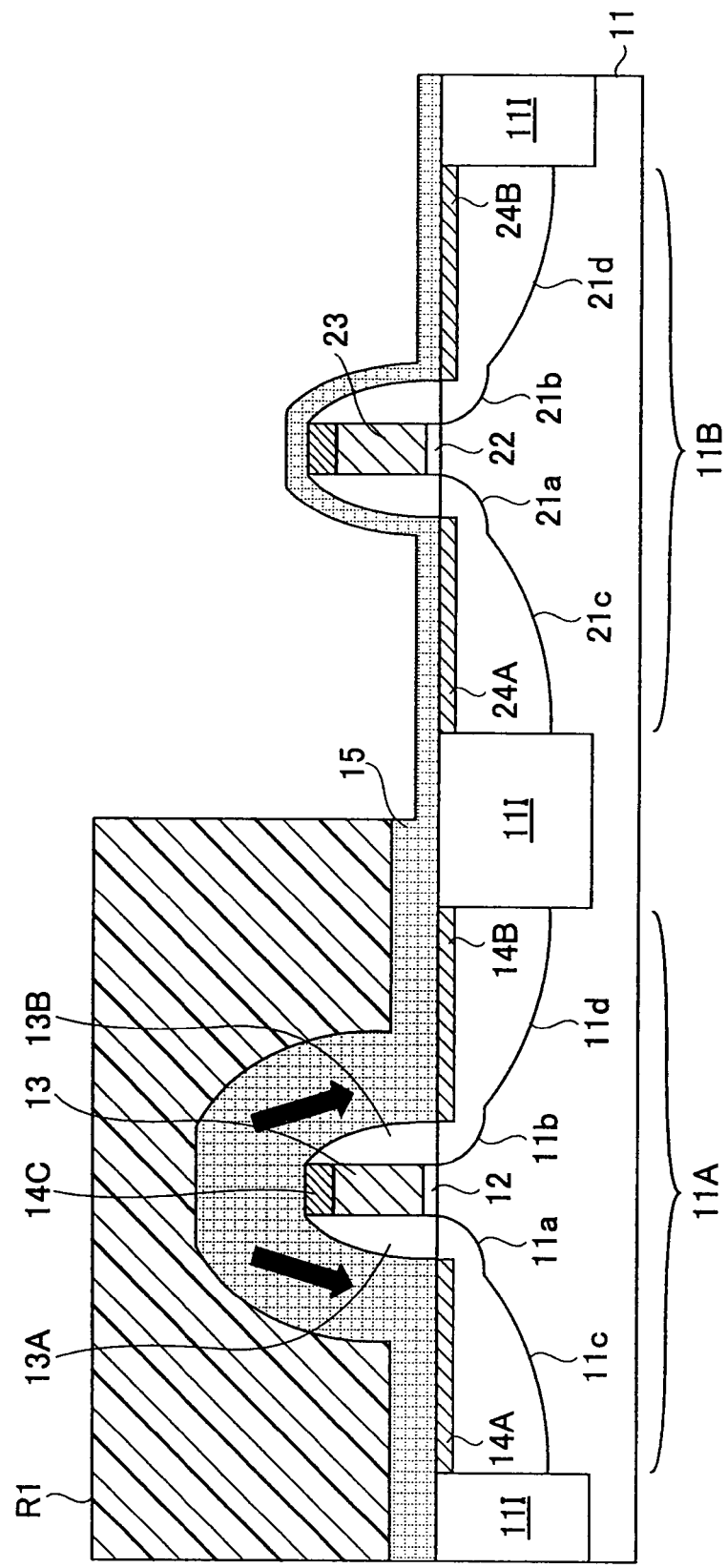
FIG. 3 is a diagram showing the construction of another conventional semiconductor integrated circuit device in which a stressor film is formed on an n-channel MOS transistor therein.

Because the Ge ions thus injected obliquely to the substrate surface hits the SiN film 45 with a steeper angle when viewed from the SiN film 45 as compared with the case explained with reference to FIG. 2 and thus can reach a deeper level in the film 45. Particularly, in the vicinity of the base part of the gate electrode 43B, the Ge ions are introduced into the part of the SiN film 45 extending parallel to the substrate surface and further to the part extending along the sidewall insulation films 44B. Thereby, there is caused concentration of Ge ions in such a part of the film 45. Further, the Ge ions hit the SiN film 45 with a deeper angle in the part thereof covering the top part of the gate electrode 45B over the sidewall insulation films 44B. Thereby, the Ge ions penetrate deeply into the film 45 also in such a part.

When Ge is introduced into an SiN film like this, etching of the SiN film by a phosphoric acid ($H_3PO_4$) etchant is facilitated, and there is caused a selective etching in the part of the SiN film where concentration of Ge is caused.

Thus, with the present embodiment, the structure of FIG. 4 is subjected to a wet etching process, in the step of FIG. 5 conducted after the step of FIG. 4, in a pyrophosphoric acid solution after removing the resist film R2.

As a result, the SiN film 45 is eroded deeply in a part 45X thereof in the vicinity of the base part of the gate electrode 43B and in a part 45Y thereof at the top part of the gate electrode 43B as shown in FIG. 5, and transmission of the stress through the SiN film 45 is positively blocked at such a part.

Particularly, transmission of compressive stress to the channel region of the p-channel MOS transistor according to the mechanism similar to the case of the n-channel MOS transistor can be suppressed effectively by forming such an erosion part 45X at least in one part of the SiN film 45 near the base of the gate electrode 45B.

After the step of FIG. 5, an interlayer insulation film 46 is deposited on the silicon substrate 41 in the step of FIG. 6, and contact holes 46A-46D are formed in the interlayer insulation film 46 so as to expose the silicide layers 41SA formed on the source and drain regions 41c and 41d of n+-type and the silicide layers 41Sb formed on the source and drain regions 41g and 41h of p+-type.

Further, by filling the contact holes 46A-46D with the conductive plugs 47A-47D, a semiconductor integrated circuit device is obtained on the silicon substrate 41 such that the n-channel MOS transistor has improved operational speed as a result of application of stress and such that degradation of operational speed is avoided in the p-channel MOS transistor.

Thereby, it should be noted that the SiN film 45 maintains the film thickness of 100 nm in the part where the conductive plugs 47C and 47D make a contact with the source diffusion region 41g and the drain diffusion region 41h in the device region 41B, and thus, the SiN film 45 functions as an effective contact etching stopper.

Thus, at the time of formation of the contact holes 46A-46D in the interlayer insulation film 46, the dry etching process forming the contact holes 46A-46D stops upon exposure of the SiN film 45, and thus, it becomes possible to expose the silicide layers 41SA and 41SB on the diffusion regions 42c, 42d, 42g and 42h without causing damaging therein, by selectively removing the SiN film thus exposed at the bottom of the contact holes 46A-46D.

Figure 7:
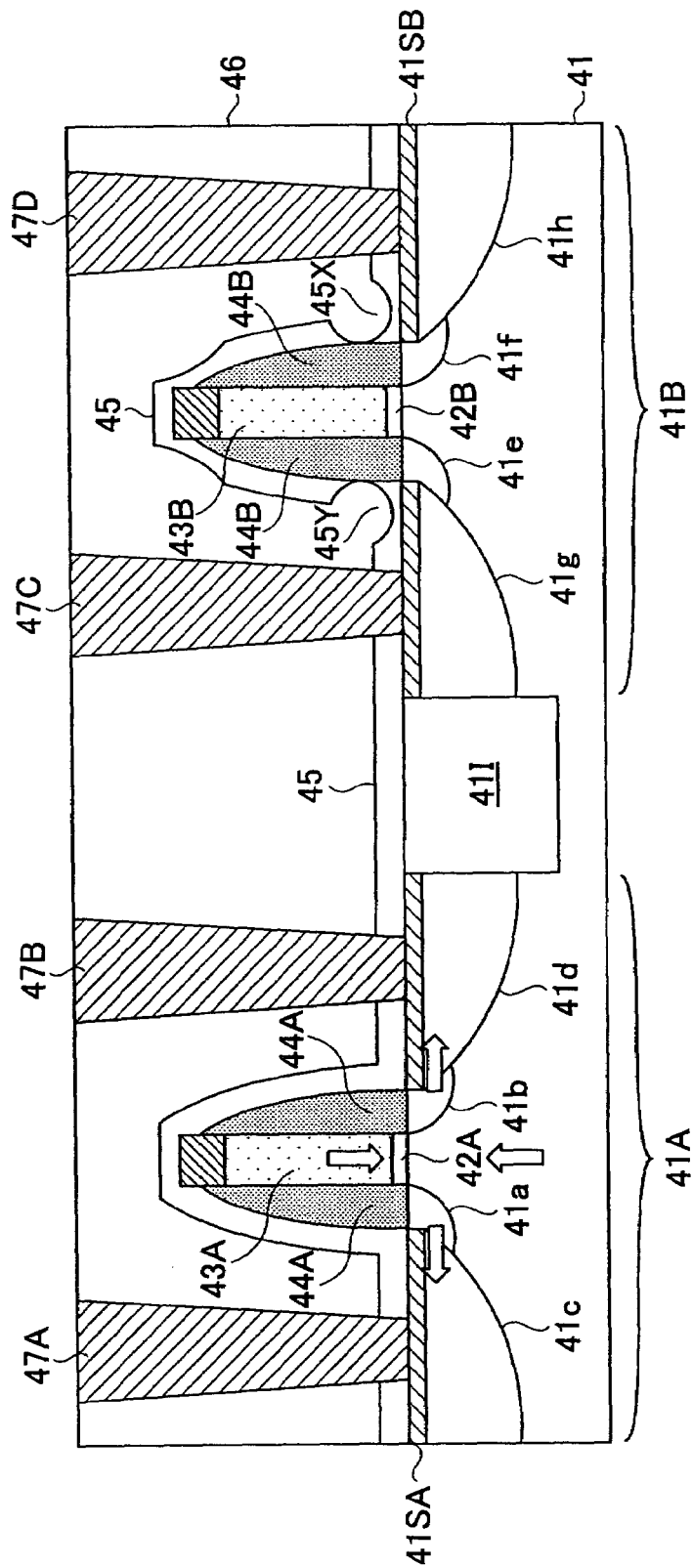
FIG. 7 is a diagram showing a modification of the semiconductor integrated circuit device according to the first embodiment of the present invention.

FIG. 7 shows a modification of the semiconductor integrated circuit device of FIG. 6, wherein those parts of FIG. 7 explained previously are designated by the same reference numerals and the description thereof will be omitted.

With the construction of FIG. 7, it should be noted that the amount of etching in the parts 45X and 45Y is increased, and as a result, the SiN film 45 is removed in the foregoing parts 45X and 45Y.

In such a case, the part of the SiN film 45 covering the gate electrode 43B above the regions 45X and 45Y is disconnected from the part of the SiN film 45 covering the silicon substrate surface, and thus, the tensile stress in the SiN film 45 is not transmitted to the channel region of the p-channel MOS transistor.

With the construction of FIG. 7, it should be noted that the silicide layers 41SB or the sidewall insulation films 44B are exposed in the foregoing parts 45X and 45Y in view of the removal of the SiN film 45 in these parts. Thereby, the Ge ions introduced previously in the step of FIG. 4 reach these exposed regions.

SECOND EMBODIMENT

FIGS. 8-11 are diagrams showing the fabrication process of a semiconductor integrated circuit device according to a second embodiment of the present invention, wherein those parts corresponding to the parts described previously are designated by the same reference numerals and the description thereof will be omitted.

Figure 8:
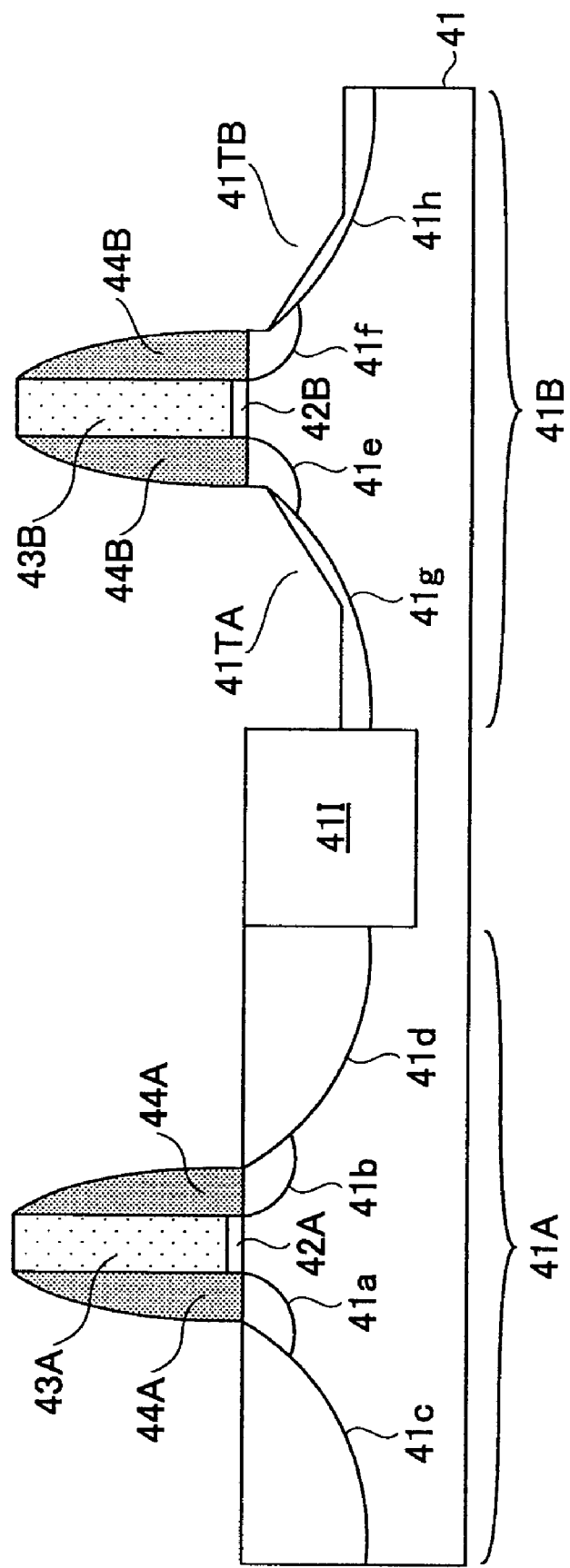
FIGS. 8-11 are diagrams showing the fabrication process of a semiconductor integrated circuit device according to a second embodiment of the present invention.

Referring to FIG. 8, the present embodiment forms an n-channel MOS transistor and a p-channel MOS transistor on the silicon substrate 41 respectively on the device region 41A and the device region 41B, such that the n-channel MOS transistor includes the polysilicon gate electrode 43A of n+-type, the source and drain extension regions 41a and 41b of n-type and the source and drain regions 41c and 41d of n+-type, and such that the p-channel MOS transistor includes the polysilicon gate electrode 43B of p+-type, the source and drain extension regions 41e and 41f of p-type and further the source and drain regions 41g and 41f of p+-type, wherein the present embodiment forms, at the time of formation of the p-channel MOS transistor in the device region 41B, trenches 41TA and 41TB in the silicon substrate 41 before the step of forming the source and drain regions 41g and 41h of p+-type, by a self-aligned etching process combining a dry etching process and a wet etching process and using the sidewall insulation films 44B as a self-aligned mask, such that each of the trenches 41TA and 41TB is defined by plural facets.

Figure 9:
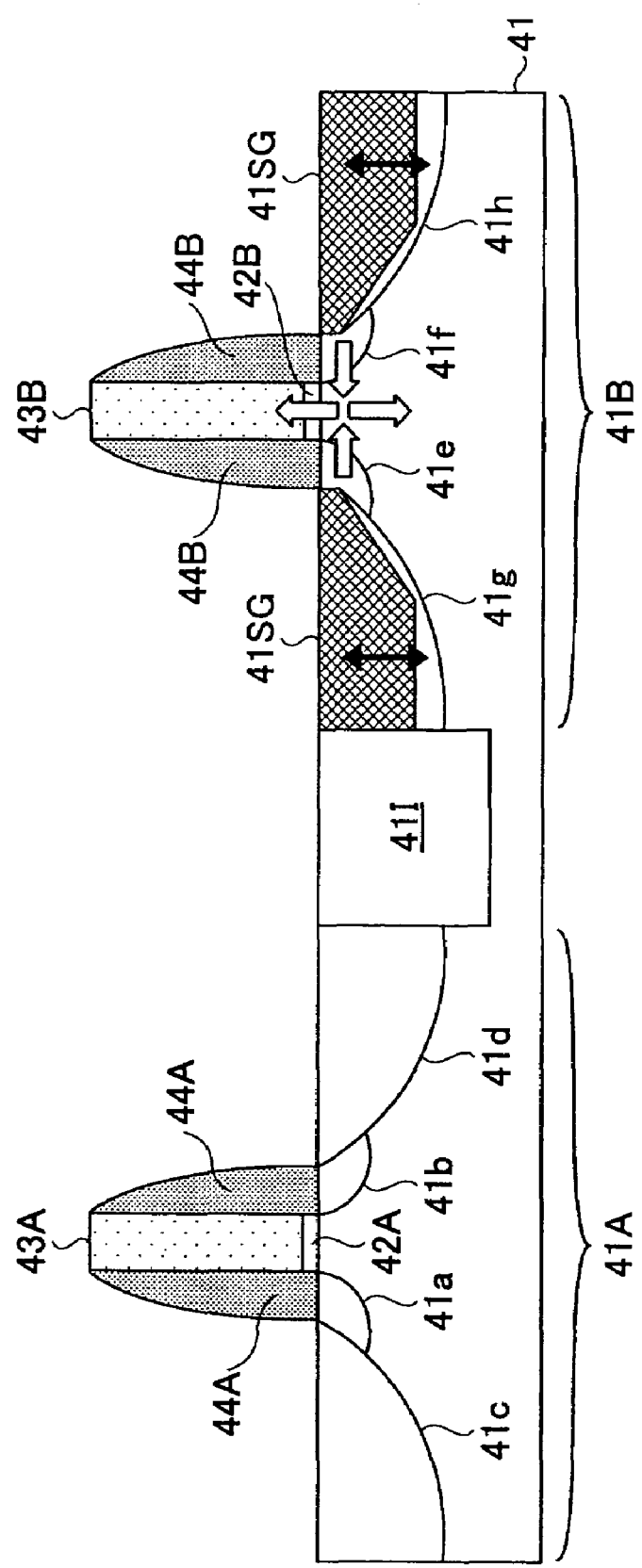

Next, in the step of FIG. 9, p-type SiGe mixed crystal layers 41SG are grown epitaxially respectively in the trenches 41TA and 41TB by a low-pressure CVD process while using $SiH_4$ and $GeH_4$ as the source gases, $B_2H_6$ as a dopant gas and HCl as an etching gas.

Because the SiGe mixed crystal layers 41SG has a larger lattice constant than the silicon substrate 41, the SiGe mixed crystals regions 41SG thus formed undergo dilatation in the direction perpendicular to the substrate surface as indicated in FIG. 9 by black arrows, and with this, the channel region right underneath the gate electrode 43B is also expanded in the direction perpendicular to the substrate surface.

As a result, the Si crystal constituting the channel region undergoes contraction in the direction parallel to the substrate surface, and there is induced a strain in the Si crystal constituting the channel region similarly to the case in which the Si channel region has been subjected to a compressive stress from the SiGe mixed crystal regions 41SG. Thereby, degeneration of heavy holes and light holes taking place in the valence band of a Si crystal is resolved in the Si crystal constituting the channel region of the p-channel MOS transistor, and the mobility of holes is improved in the p-channel MOS transistor.

Figure 10:
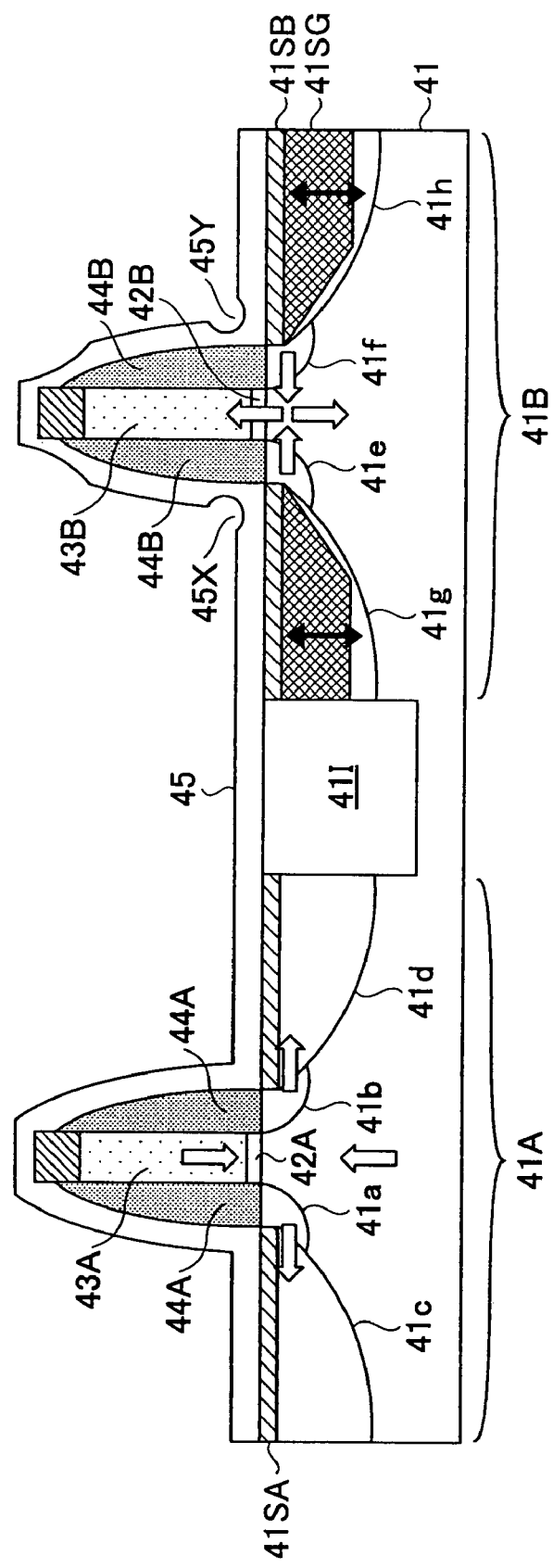

Next, in the step of FIG. 10, the silicide layers 41SA are formed on the source and drain regions 41c and 41d of the device region 41A and the silicide layers 41SB are formed on the source and drain regions 41e and 41f of the device region 41B by a salicide process. Further, the silicide layers 43SA and 43SB are formed respectively on the polysilicon gate electrodes 43A and 43B. Thereafter, the SiN film 45 is deposited by the low-pressure CVD process explained previously under the condition such that the film 45 accumulates a tensile stress therein.

Further, with the step of FIG. 10, the Ge ion implantation process and the etching process explained with reference to FIGS. 4 and 5 are conducted to the SiN film 45 in the device region 41B, and as a result, there is obtained a structure in which the film thickness of the SiN film 45 is decreased or the SiN film 45 is removed at the base part of the gate electrode 43B in the device region 41B. Thereby, the expansion of the channel region right underneath of the gate electrode 43B in the vertical direction to the substrate surface together with the dilatation of the SiGe mixed crystal layers 41SG in the vertical direction of the substrate surface, is no longer prevented by the tensile stress of the SiN film 45.

In the device region 41A, on the other hand, the gate electrode 43A is urged against the silicon substrate 41 as a result of the tensile stress of the SiN film 45 as explained previously, and as a result of the corresponding in-plane dilatation of the Si crystal in the channel region right underneath the gate electrode 43A, there occurs an increase of electron mobility in the channel region. Thereby, the operational speed of the n-channel MOS transistor is improved.

Figure 11:
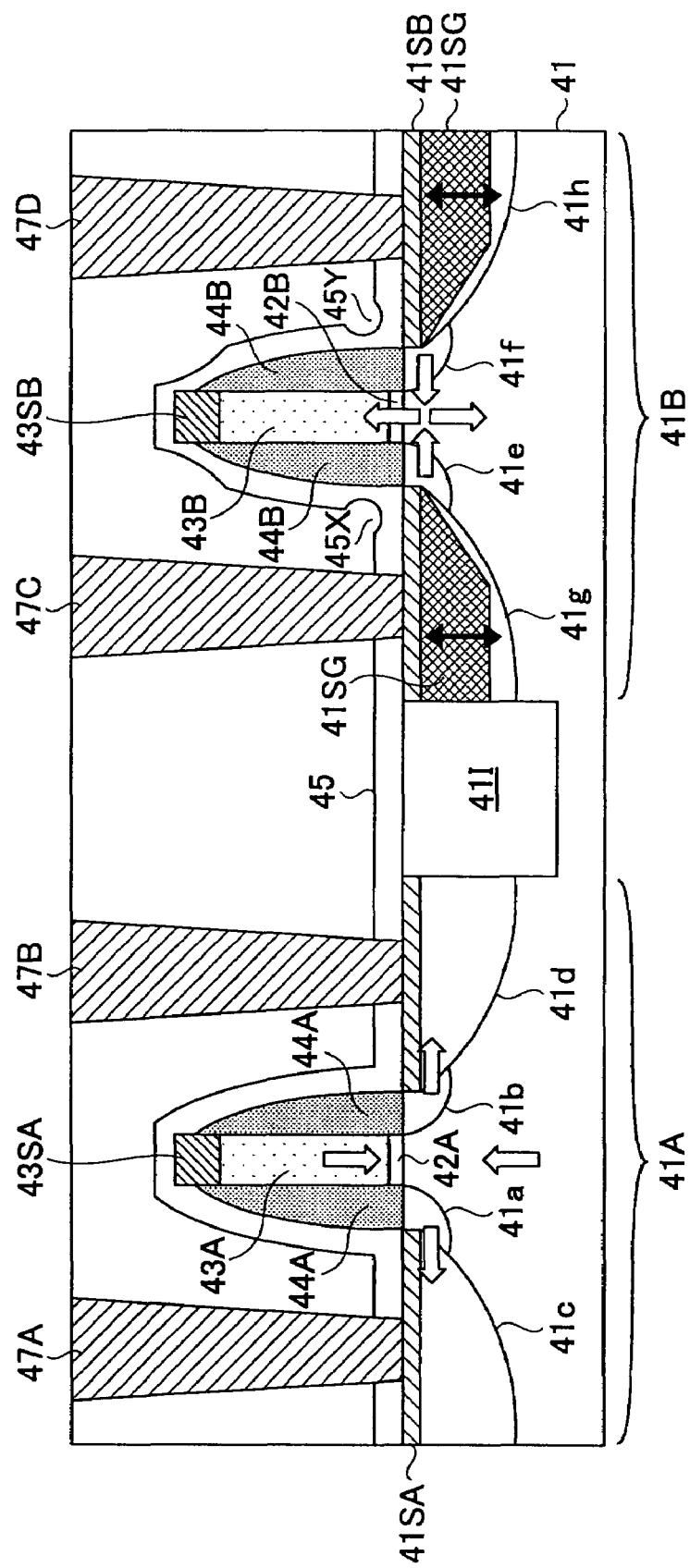

Further, in the step of FIG. 11, the interlayer insulation film 46 is formed on the structure of FIG. 10, and the conductive plugs 47A-47D are formed in the interlayer insulation film 46. Thereby, a semiconductor integrated circuit device in which the operational speed is improved in any of the n-channel MOS transistor and p-channel MOS transistor as a result of stress application is obtained.

Further, the present invention is not limited to the embodiments described heretofore, but various variations and modifications may be made without departing from the scope of the invention.

What is claimed:

1. A semiconductor integrated circuit, comprising:
   a substrate;
   first and second device regions defined on said substrate by a device isolation region;
   an n-channel MOS transistor formed on said first device region; and
   a p-channel MOS transistor formed in said second device region;
   said n-channel MOS transistor comprising: a first gate electrode doped to n-type and formed on said first device region in correspondence to a channel region of said n-channel MOS transistor via a first gate insulation film, said first gate electrode carrying sidewall insulation films on respective sidewall surfaces thereof; source and drain regions of n-type formed in said first device region at respective lateral sides of said first gate electrode,
   said p-channel MOS transistor comprising: a second gate electrode doped to p-type and formed in said second device region in correspondence to a channel region of said p-channel MOS transistor, said second gate electrode carrying sidewall insulation films on respective sidewall surfaces thereof; and source and drain regions of p-type formed in said second device region at respective lateral sides of said second gate electrode,
   wherein there is provided a stressor film on said substrate over said first and second device regions such that said stressor film covers said first gate electrode in said first device region including said sidewall insulation films thereof and such that said stressor film covers said second gate electrode in said second device region including said sidewall insulation films thereof,
   said stressor film having a first film thickness in a first part of said stressor film located in the vicinity of a base part of said second gate electrode and a second film thickness in a second part of said stressor film located outside of said first part, said first film thickness being smaller than a second film thickness.

2. The semiconductor integrated circuit device as claimed in claim 1, wherein said sidewall insulation film of said second gate electrode is exposed from said stressor film in the vicinity of a base part of said second gate electrode.

3. The semiconductor integrated circuit device as claimed in claim 2, wherein said exposed sidewall insulation film contains Ge in said second device region.

4. The semiconductor integrated circuit device as claimed in claim 1, wherein said source and drain regions of said p-channel MOS transistor are exposed from said stressor film in the vicinity of said base part of said second gate electrode, said exposed part of said source and drain regions contains Ge.

5. The semiconductor integrated circuit device as claimed in claim 4, wherein a silicide layer is formed on said exposed part of said source and drain regions, and wherein said silicide layer contains Ge in said exposed part.

6. The semiconductor integrated circuit device as claimed in claim 1, wherein said stressor film comprises a silicon nitride film.

7. The semiconductor integrated circuit device as claimed in claim 1, wherein said substrate carries an interlayer insulation film over said first and second device regions via said stressor film such that said interlayer insulation film covers said first and second gate electrodes,
   said interlayer insulation film including a pair of contact plugs in correspondence to said first device region so as to make a contact respectively with said source and drain regions of n-type of said n-channel MOS transistor via corresponding openings formed in said stressor film,
   said interlayer insulate film further including another pair of contact plugs in correspondence to said second device region so as to make a contact respectively with said source and drain regions of p-type of said p-channel MOS transistor via corresponding openings formed in said stressor film.

8. The semiconductor integrated circuit device as claimed in claim 1, wherein said first film thickness is smaller than a thickness of said stressor film in the vicinity of said first electrode.

9. A semiconductor integrated circuit, comprising:
   a substrate;
   first and second device regions defined on said substrate by a device isolation region;
   an n-channel MOS transistor formed on said first device region; and
   a p-channel MOS transistor formed in said second device region;
   said n-channel MOS transistor comprising: a first gate electrode doped to n-type and formed on said first device region in correspondence to a channel region of said n-channel MOS transistor via a first gate insulation film, said first gate electrode carrying sidewall insulation films on respective sidewall surfaces thereof; source and drain regions of n-type formed in said first device region at respective lateral sides of said first gate electrode,
   said p-channel MOS transistor comprising: a second gate electrode doped to p-type and formed in said second device region in correspondence to a channel region of said p-channel MOS transistor, said second gate electrode carrying sidewall insulation films on respective sidewall surfaces thereof; and source and drain regions of p-type formed in said second device region at respective lateral sides of said second gate electrode,
   wherein there is provided a stressor film on said substrate over said first and second device regions such that said stressor film covers said first gate electrode in said first device region including said sidewall insulation films thereof and such that said stressor film covers said second gate electrode in said second device region including said sidewall insulation films thereof,
   said stressor film having a decreased film thickness in said second device region selectively in the vicinity of a base part of said second gate electrode,
   wherein said sidewall insulation film of said second gate electrode is exposed from said stressor film in the vicinity of a base part of said second gate electrode.

10. The semiconductor integrated circuit device as claimed in claim 9, wherein said exposed sidewall insulation film contains Ge in said second device region.

11. A semiconductor integrated circuit, comprising:
    a substrate;
    first and second device regions defined on said substrate by a device isolation region;

an n-channel MOS transistor formed on said first device region; and a p-channel MOS transistor formed in said second device region;

said n-channel MOS transistor comprising: a first gate electrode doped to n-type and formed on said first device region in correspondence to a channel region of said n-channel MOS transistor via a first gate insulation film, said first gate electrode carrying sidewall insulation films on respective sidewall surfaces thereof; source and drain regions of n-type formed in said first device region at respective lateral sides of said first gate electrode, said p-channel MOS transistor comprising: a second gate electrode doped to p-type and formed in said second device region in correspondence to a channel region of said p-channel MOS transistor, said second gate electrode carrying sidewall insulation films on respective sidewall surfaces thereof; and source and drain regions of p-type formed in said second device region at respective lateral sides of said second gate electrode, wherein there is provided a stressor film on said substrate over said first and second device regions such that said stressor film covers said first gate electrode in said first device region including said sidewall insulation films thereof and such that said stressor film covers said second gate electrode in said second device region including said sidewall insulation films thereof, said stressor film having a decreased film thickness in said second device region selectively in the vicinity of a base part of said second gate electrode, wherein said source and drain regions of said p-channel MOS transistor are exposed from said stressor film in the vicinity of said base part of said second gate electrode, said exposed part of said source and drain regions contains Ge.

12. The semiconductor integrated circuit device as claimed in claim 11, wherein a silicide layer is formed on said exposed part of said source and drain regions, and wherein said silicide layer contains Ge in said exposed part.

* * * * *